(12) United States Patent
Buss et al.

(10) Patent No.: US 9,344,014 B2
(45) Date of Patent: May 17, 2016

(54) PIEZOELECTRIC DEVICE

(71) Applicant: Texas Instruments Incorporated, Dallas, TX (US)

(72) Inventors: Dennis Darcy Buss, Dallas, TX (US); Yogesh Kumar Ramadass, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 342 days.

(21) Appl. No.: 14/015,647

(22) Filed: Aug. 30, 2013

(65) Prior Publication Data

US 2014/0062256 A1    Mar. 6, 2014

Related U.S. Application Data

(60) Provisional application No. 61/697,174, filed on Sep. 5, 2012.

(51) Int. Cl.
 *H01L 41/113* (2006.01)
 *H02N 2/18* (2006.01)

(52) U.S. Cl.
 CPC ............... *H02N 2/181* (2013.01); *H02N 2/188* (2013.01); *H01L 41/1136* (2013.01)

(58) Field of Classification Search
 USPC .................................. 310/319, 329–332, 339
 See application file for complete search history.

(56) References Cited

U.S. PATENT DOCUMENTS 8,026,650 B2 *  9/2011 Ramadass et al. ............ 310/318
8,319,402 B1 * 11/2012 Churchill et al. ............. 310/339
2005/0088059 A1 *  4/2005 Ohkubo et al. ............... 310/319
2009/0045696 A1 *  2/2009 Suzuki .......................... 310/317
2012/0212101 A1 *  8/2012 Tabata et al. .................. 310/319

FOREIGN PATENT DOCUMENTS

JP          2013-080768 A  *  5/2013  .............. H01L 41/08

OTHER PUBLICATIONS

Zhao, Jianying; Ramadass, Yogesh; Lang, Jeffrey; Ma, Jianguo; Buss, Dennis, "Bias-Flip Technique for Frequency Tuning of Piezo-Electric Energy Harvesting Devices," Journal of Low Power Electronics and Applications, ISSN 2079-9268, www.mdpi.com/journal/jlpea, 21 pages.

Zhao, Jianying; Ramadass, Yogesh; Buss, Dennis; Ma, Jianguo, "Microelectronic Techniques for Frequency Tuning of Piezo-Electric Energy Harvesting Devices," 2012 IEEE Subthreshold Microelectronics Conference, Waltham MA USA Oct. 2012, 4 pages.

* cited by examiner

*Primary Examiner* — Thomas Dougherty
(74) *Attorney, Agent, or Firm* — John R. Pessetto; Frank D. Cimino

(57) ABSTRACT

Piezoelectric harvesting devices are disclosed herein. An embodiment of a harvesting device includes a cantilever having a resonant frequency associated therewith, wherein the cantilever vibrates when in the presence of a vibration source, and wherein the harvesting device generates a current upon vibration of the cantilever. The generated current is present at an output. A bias flip circuit is used to tune the resonant frequency of the harvesting device based on measurements of the vibration source that causes the cantilever to vibrate, wherein the bias flip circuit includes a switch that connects and disconnects an inductor to the output.

12 Claims, 6 Drawing Sheets

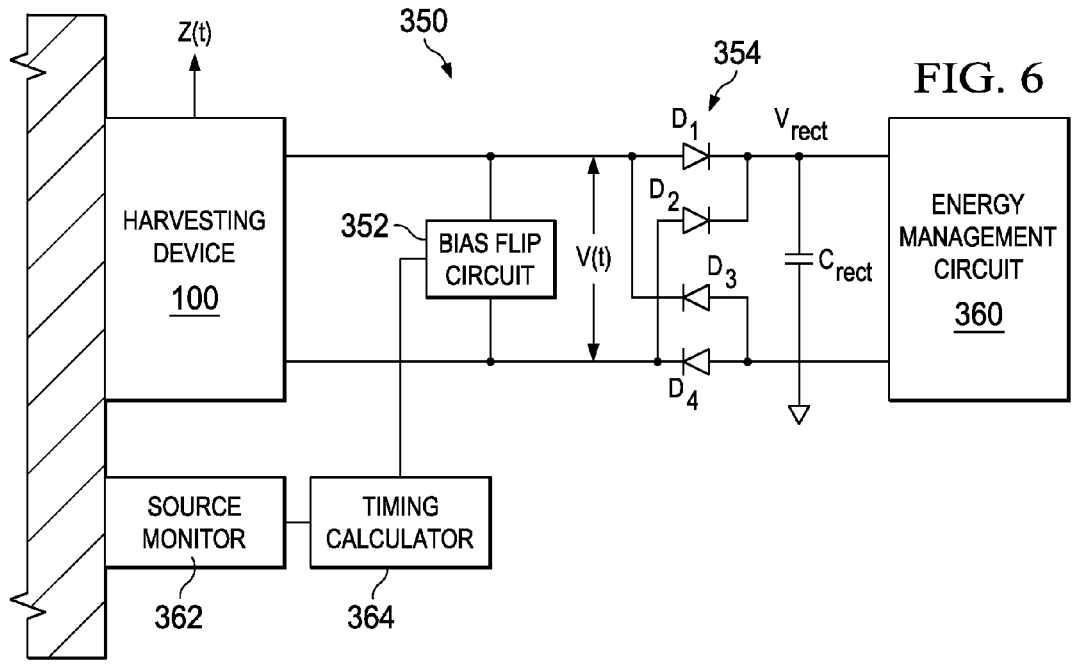
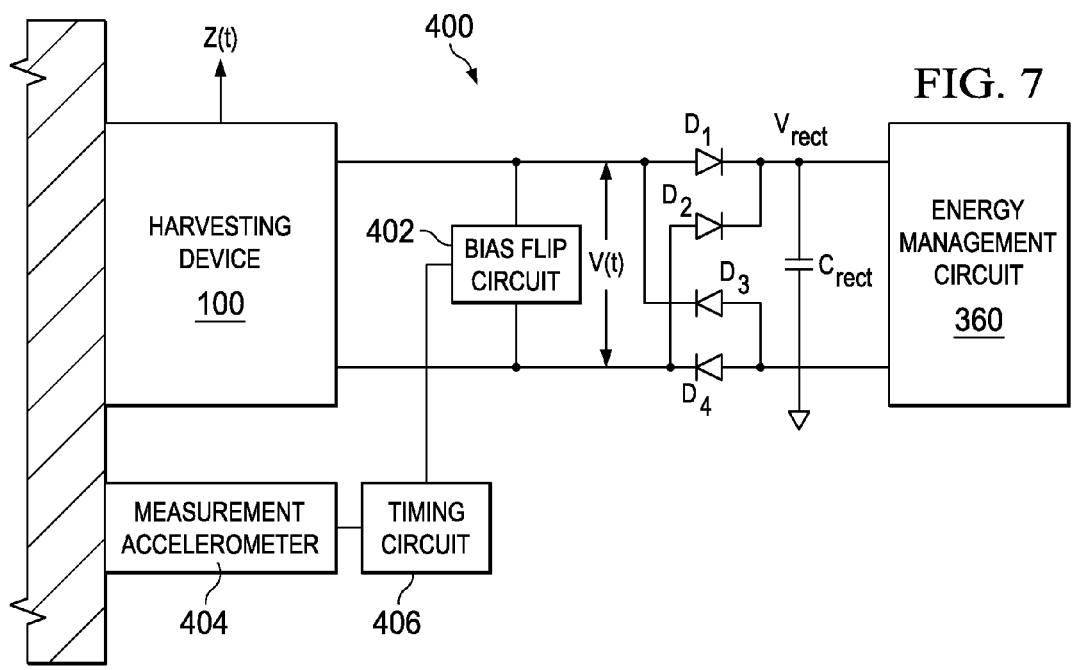

PIEZOELECTRIC DEVICE

This application claims priority to U.S. provisional patent application 61/697,174 filed on Sep. 5, 2012, which is hereby incorporated for all that is disclosed therein.

BACKGROUND

Devices for harvesting vibration energy are often mechanical resonators with high-Q, wherein Q is the quality factor of the resonator. One example of such a device is a piezoelectric harvester. The piezoelectric harvesting devices typically have a cantilever that vibrates when it is in the presence of vibration energy. The cantilever is coupled to or otherwise connected to piezoelectric material that generates electricity from the vibrations.

One problem with high-Q mechanical resonators, such as piezoelectric harvesters, is that they resonate at a single frequency, whereas the sources of vibration energy are usually not monotonic, stable, and predictable. Therefore, there is a mismatch between the mechanical resonant frequency of the piezoelectric harvesters and the frequency of the vibration sources. The result is low power output from the mechanical resonators.

SUMMARY

Piezoelectric harvesting devices are disclosed herein. An embodiment of a harvesting device includes a cantilever having a resonant frequency associated therewith, wherein the cantilever vibrates when in the presence of a vibration source, and wherein the harvesting device generates a current upon vibration of the cantilever. The generated current is present at an output. A bias flip circuit is used to tune the resonant frequency of the harvesting device based on measurements of the vibration source that causes the cantilever to vibrate, wherein the bias flip circuit includes a switch that connects and disconnects an inductor to the output.

BRIEF DESCRIPTION OF THE DRAWINGS

FIG. 6 is an embodiment of a harvesting device using a bias flip circuit to change the phase of the output voltage relative to the phase of the vibration source displacement.

FIG. 7 is an embodiment of a harvesting device using a bias flip circuit to change the phase of the output voltage relative to the phase of the vibration source acceleration.

DETAILED DESCRIPTION

Figure 1:
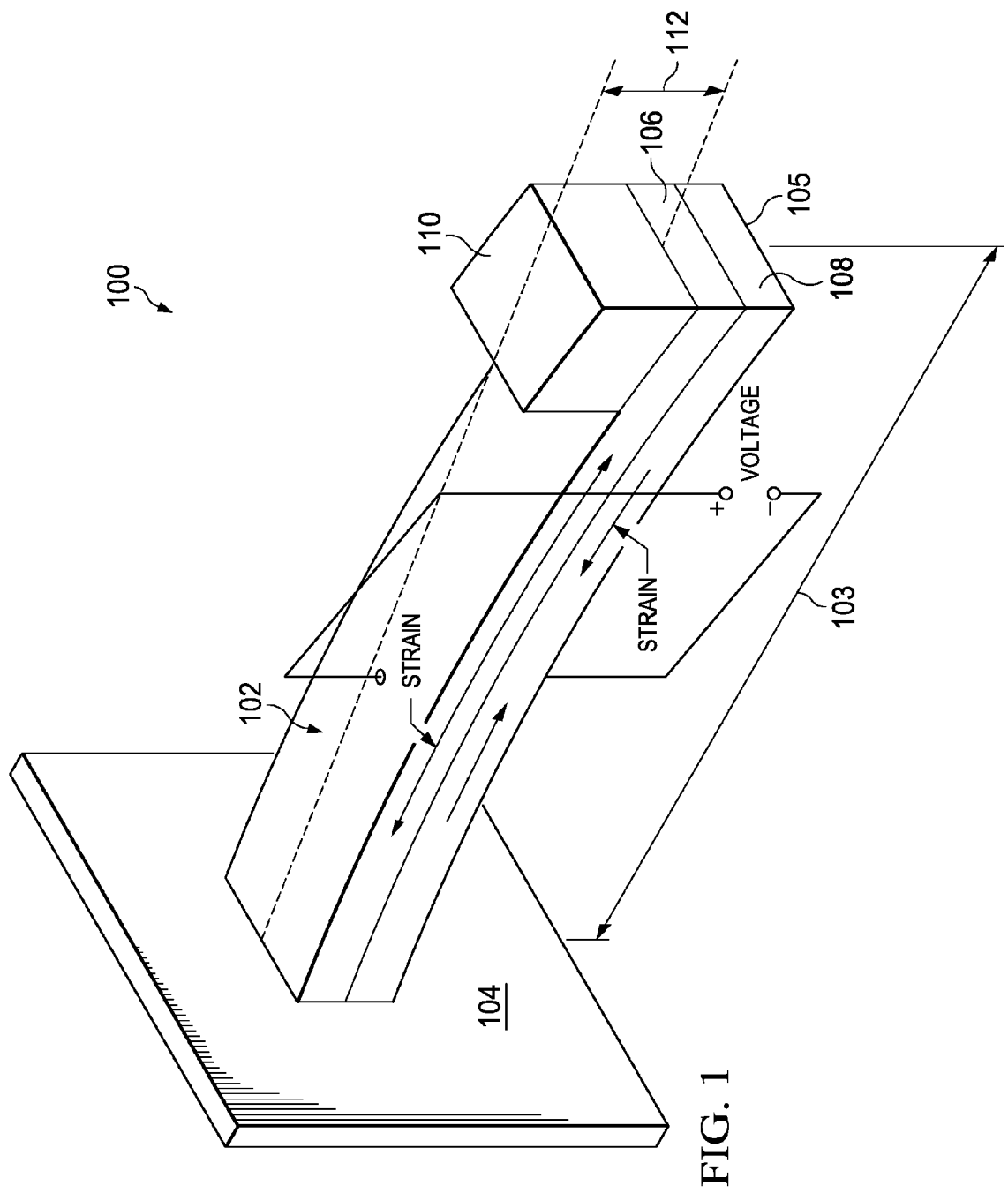
FIG. 1 is an isometric view of an embodiment of a piezoelectric harvesting device.

Piezoelectric harvesting devices (sometimes referred to herein simply as "harvesting devices") and circuits connected to the harvesting devices are disclosed herein. An example of a harvesting device 100 is shown in FIG. 1. The harvesting device 100 includes a cantilever beam 102 (sometimes referred to simply as the "cantilever 102"). The cantilever 102 has a length 103 extending from a support structure 104 to an end 105. The cantilever 102 has two elements, a first element 106 and a second element 108, which are piezoelectric materials. A mass 110 is attached to the cantilever 102 proximate the end 105. In some embodiments, cantilever 102 does not have a separate mass 110 attached thereto, so the mass 110 represents an effective mass of the cantilever 102. As the cantilever 102 bends, strain forces in opposite directions are generated in the elements 106, 108. These strain forces generate current, which is harvested by the harvesting device 100. In the embodiment of FIG. 1, the cantilever 102 is shown bending or displacing a distance 112 from a point of equilibrium. The displacement is sometimes referred to herein as X and the displacement as a function of time is referred to as X(t).

Figure 2A:
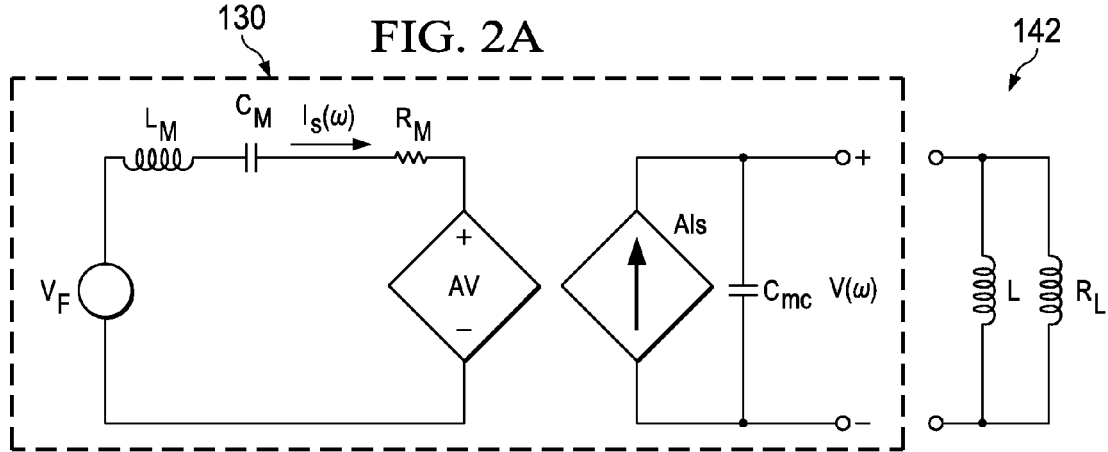
FIG. 2A is an equivalent circuit representative of the piezoelectric harvesting device of FIG. 1.
Figure 2B:
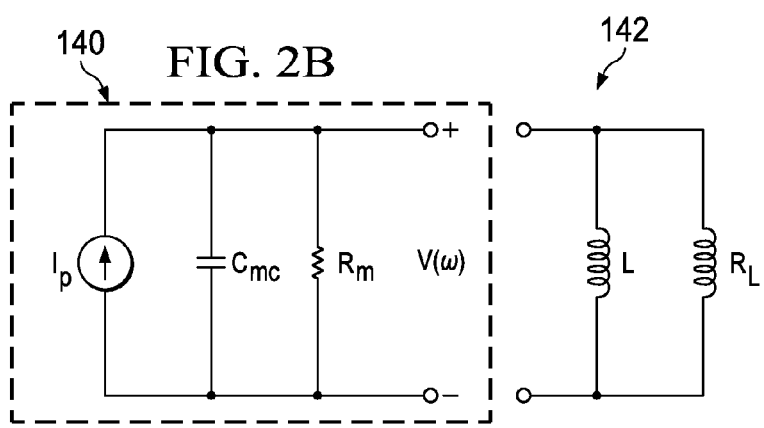
FIG. 2B is an equivalent circuit representative of the piezoelectric harvesting device of FIG. 1 operating at the mechanical resonant frequency.

The magnitude of current generated by the harvesting device 100 is proportional to the displacement of the cantilever 102. The cantilever 102 has a resonant or mechanical frequency $\omega_m$, so when a vibration source oscillates or vibrates the cantilever 102 at the resonant frequency $\omega_m$, maximum displacement is achieved and the maximum current is generated by the harvesting device 100. An embodiment of an equivalent circuit 130 of the harvesting device 100 is shown in FIG. 2A. An equivalent circuit 140 of the harvesting device 100 operating at the mechanical frequency $\omega_m$ is shown in FIG. 2B. The mechanical frequency $\omega_m$ is sometimes referred to as the resonant frequency. The circuit 140 has a current source $I_P$, an internal capacitance $C_{mc}$, and an internal or input resistance $R_{in}$. The current source $I_P$ generates current based on the vibration of the cantilever 102 of FIG. 1. As described in greater detail below, the circuit 130, and thus the harvesting device 100 can be tuned to the frequency $\omega$ of a vibration source by adding a resonant tank circuit 142 to the circuit 130. A bias flip circuit may also be connected to the harvesting device 100 in order to achieve the maximum output when the source frequency $\omega$ is different than the mechanical frequency $\omega_m$.

The generation of current by the harvesting device 100 will now be described with reference to the circuit 140. When the cantilever 102 is vibrating at the mechanical or resonant frequency $\omega_m$, the current source $I_P$ has a value as shown by equation 1 as:

$$I_p = \rho Q_m \omega_m C_{mc} Z/d = \frac{Z/d}{R_{in}} \qquad \text{Equation (1)}$$

The resistance $R_{in}$ is equal to:

$$R_{in} = (\rho Q_m \omega_m C_{mc})^{-1} \qquad \text{Equation (2)}$$

where:

$$\rho = \frac{\kappa^2}{1-\kappa^2} \qquad \text{Equation (3)}$$

and $$\kappa^2 = \frac{Y}{\varepsilon}d^2 \qquad \text{Equation (4)}$$

where Y is Young's modulus of the material of the cantilever 102, ∈ is the dielectric constant of the cantilever 102, and d is the piezoelectric coupling constant. As described above, the current generated by the current source $I_P$ of equation 1 only applies when the source of the vibration energy has the same frequency ω as the mechanical frequency $\omega_m$ of the cantilever 102. When the two frequencies are not equal, the current output by the current source $I_P$ decreases.

The circuits and methods described herein overcome the problem of the harvesting device 100 only providing maximum power output when the cantilever 102 oscillates at the mechanical frequency $\omega_m$. More specifically, the circuits and methods described herein disclose techniques for electrically changing the mechanical frequency of the energy harvesting device 100 to frequencies different than the mechanical resonance $\omega_m$ where it would otherwise resonate.

The technique for tuning the harvesting device 100 is based on the principal that the output voltage (V in FIG. 2B) of the harvesting device 100 results from an electric field in the piezoelectric material in the cantilever 102, which changes the effective Young's modulus. The change in the Young's modulus changes the spring constant and the resonant frequency of the cantilever 102. The tuning technique can also be understood in terms of coupled resonators. The output inductor L, or a bias flip inductor as described further below, forms an electrical tank circuit, together with the capacitor $C_{mc}$. This electrical resonator is coupled to the mechanical resonator resulting in two coupled resonators (a 4-pole system), and the electrical resonator can "pull" the mechanical frequency $\omega_m$ of the cantilever 102 toward the frequency ω of the vibration source. The inductor L is shown in the tank circuit 142 of FIG. 2A and the bias-flip circuit is described further below.

Based on the techniques described above, there are two electrical variables with which to optimize output power, which is directly related to the current $I_P$. The first is by way of a load resistor $R_L$, which is the real part of the electrical impedance in the tank circuit 142. The load resistor $R_L$ can shift the mechanical frequency $\omega_m$. In embodiments where the output voltage is rectified and the energy is stored, the rectified voltage $V_{rect}$ has an effect similar to the load resister $R_L$. The load inductance L, or the effective value of the bias-flip inductor that is described below, affects the reactive impedance. This inductance can be used to tune the mechanical frequency $\omega_m$ as described below.

Based on the foregoing description, impedances and resistances may be connected to the harvesting device 100 to optimize the output power. A variable w will be used herein to normalize the frequencies. The variable w is equal to the frequency ω of the vibration source divided by the mechanical frequency $\omega_m$ of the cantilever 102. At the frequency ω here w=1 (ω=$\omega_m$), the equivalent circuit 140 shows that output of the current source $I_P$ is optimized by impedance matching.

A technique for tuning the harvesting device is achieved by changing the output voltage V. Two equations related to the operation of piezoelectric devices are shown in equations (5) and (6) as follows:

$$\delta = \frac{\sigma}{Y} + dE \qquad \text{Equation (5)}$$

$$D = \varepsilon E + d\sigma \qquad \text{Equation (6)}$$

where δ is the mechanical strain (displacement/length), σ is the mechanical stress (force/area), Y is Young's modulus (force/area), d is the piezoelectric coefficient (m/volt), E is the electric field (volts/meter), D is the electrical displacement (coulomb/m²), and ∈ is the dielectric constant (coulomb/volt-meter).

When the output is shorted, E is equal to zero and the mechanical stiffness of the cantilever 102 is determined by Young's modulus where $k_m$=ApY/tp, and where tp is the distance between the plates. The short circuit resonant or mechanical frequency $\omega_m$ is given by equation (7) as follows:

$$\omega_m^2 = \frac{k_m}{m} \qquad \text{Equation (7)}$$

where $k_m$ is the mechanical short circuit spring constant and m is the mass 110 of the cantilever 102.

When the output is in the open circuit condition, D is equal to zero and the mechanical stiffness is defined as $k_{oc}$=$k_m$(1+ρ). Based on the foregoing equations, the open circuit and closed circuit resonant frequencies $\omega_{oc}$ and $\omega_m$ are related by equation (8) as follows:

$$\omega_{oc}^2 = \omega_m^2(1+\rho) \qquad \text{Equation (8)}$$

Two capacitances are defined, an electrical capacitance Ce and a constrained capacitance $C_{mc}$. The electrical capacitance Ce is equal to ∈Ap/tp and is related to situations where there is no stress (σ=0) on the cantilever 102. The variable Ap is the area of the plates of the piezoelectric device and the variable tp is the distance between the plates. The constrained capacitance $C_{mc}$ is defined as $C_e$/(1+ρ) for the case when δ=0. When the capacitances and frequencies are substituted into the equations related to piezoelectric devices, the output voltage V is calculated per equation (9) as follows:

$$V = \frac{-\rho \omega^4 Z/d}{\left(\omega_m^2 - \omega^2 + \frac{j\omega\omega_m}{Q_m}\right)(\omega_{mc}^2 - \omega^2 + j\omega\omega_m G_L^N) - \rho\omega^2\omega_m^2} \qquad \text{Equation (9)}$$

For reference, when the vibration source frequency ω is equal to the mechanical frequency $\omega_m$, equation (9) reduces to the common form of voltage as shown in equation 10.

$$V = \frac{I_P}{G_L + G_{in} + j\omega_m C_{mc} + (j\omega_m L)^{-1}}$$

$$= \frac{\rho Q_m Z/d}{G_L^N + G_{in}^N + j\left(1 - \frac{\omega_{mc}^2}{\omega_m^2}\right)} \qquad \text{Equation (10)}$$

where $G_L$ is the load conductance, $1/K_L$; $G_{in}$ is the internal conductance; $G_L^N$ is the normalized load conductance; and $G_{in}^N$ is the normalized internal conductance. Per the above-described equations, the circuit 140 is accurate when the source frequency ω is equal to the mechanical frequency $\omega_m$. At this frequency, the current $I_P$ is independent of the load on the output. When the source frequency ω is not equal to the mechanical frequency $\omega_m$, the current $I_P$ changes as the load changes. The tank circuit 142 includes the inductor L that serves to cancel the reactance of the harvesting device 100 when the source frequency ω is not equal to the mechanical frequency $\omega_m$. The inductor L is used to achieve the maximum power output from the harvesting device 100, which is given by equation (11) as follows:

$$P_{max}^{av} = \frac{1}{8}\left(\frac{Z}{d}\right)^2 G_{in} \qquad \text{Equation (11)}$$

When an inductor value as described in equation (12) is selected in the tank circuit 142, two peaks may be present in the frequency response.

$$L = (\omega_m^2 C_{mc})^{-1} \qquad \text{Equation (12)}$$

When the frequency of equation (12) is substituted into equation (9), variations in the mechanical frequency $\omega_{mc}$ are equivalent to varying the inductance of the inductor L. Based on the foregoing, maximizing the power with respect to $\omega_{mc}$ yields equation (13) as follows:

$$\omega_{mc}^2 = \omega^2 + \frac{(\omega_m^2 - \omega^2)\omega^2\omega_m^2\rho}{(\omega_m^2 - \omega^2)^2 + \frac{\omega^2\omega_m^2}{Q_m^2}} \qquad \text{Equation (13)}$$

Figure 3:
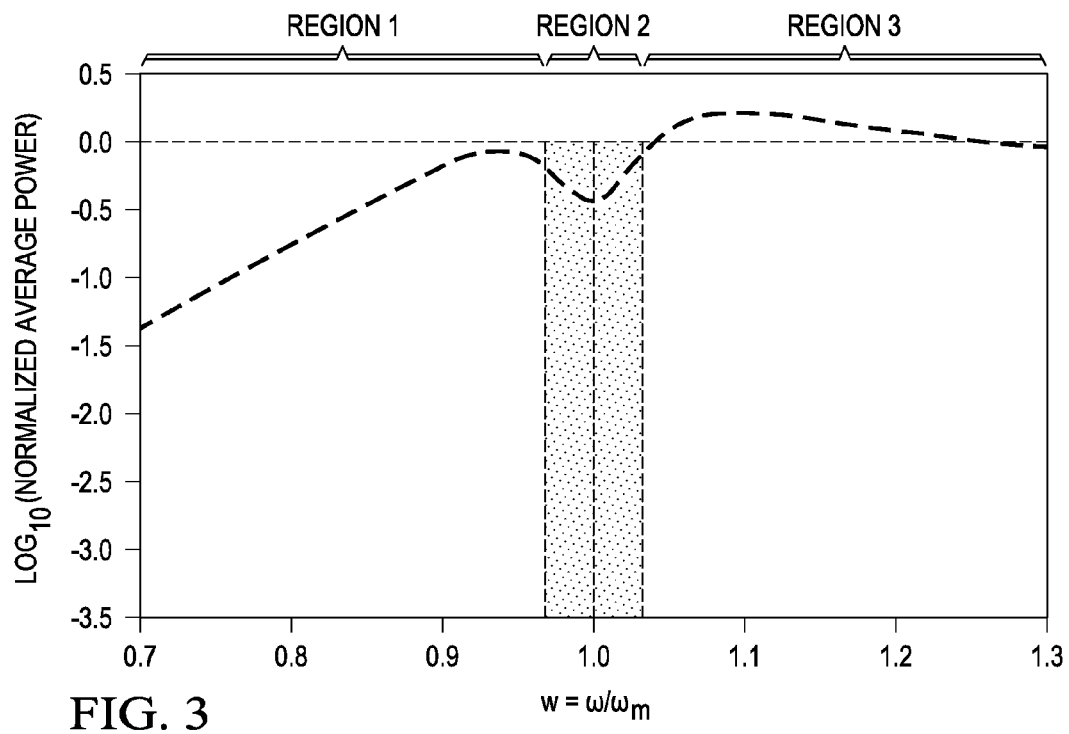
FIG. 3 is a graph showing an example of the frequency response of the harvesting device of FIG. 1.

An example of the results of the normalized power are shown in the graph of FIG. 3 for different frequency regions. The result of equation 13 and the graph of FIG. 3 show that different techniques are required for maximizing the power depending on the frequency ω of the vibration source. The graph of FIG. 3 is divided into three regions. Region 2 relates to frequencies ω that are near the mechanical frequency $\omega_m$, which causes equation (13) to reduce to equation (14) as follows:

$$\omega_{mc}^2 = \omega^2 + (\omega_m^2 - \omega^2)\rho Q_m^2 \qquad \text{Equation (14)}$$

It can be seen that when w is equal to or close to $\omega_m$, $\omega_{mc}$ becomes equal to ω. As described above, this situation is the same as matching the inductance of the inductor L to the capacitance of the capacitor $C_{mc}$ of FIG. 2B. In the other situation when the source frequency ω is greater than or less than the mechanical frequency $\omega_m$, the frequency response corresponds to regions 1 and 3. In these situations, equation 13 reduces to a pole splitting equation.

In some embodiments, region 2 has a bandwidth of approximately $+/-(2Q_m)^{-1}$. In this region, power is optimized by using equation 14 for reactive admittance and $G_L$ is substantially equal to $G_{in}$.

A bias flip circuit may be used to simulate an inductance that optimizes the power output of the harvesting device 100 when the frequency is in any of the regions 1, 2, or 3 as shown in FIG. 3. When the vibration source frequency ω is in region 1 where it is less than the mechanical frequency $\omega_m$, the maximum power transfer occurs when the output voltage V has a phase of positive ninety degrees relative to the frequency ω of the vibration source. The displacement of the vibration source is sometimes referred to as Z or Z(t). When the vibration source frequency ω is in region 3 where it is greater than the mechanical frequency $\omega_m$, the maximum power transfer occurs when the output voltage V has a phase of negative ninety degrees relative to the frequency ω of the vibration source. As shown above, when the vibration source frequency ω is equal to the mechanical frequency $\omega_m$, the maximum power transfer occurs when the phase of the output voltage V is equal to the phase of the vibration source.

Figure 4:
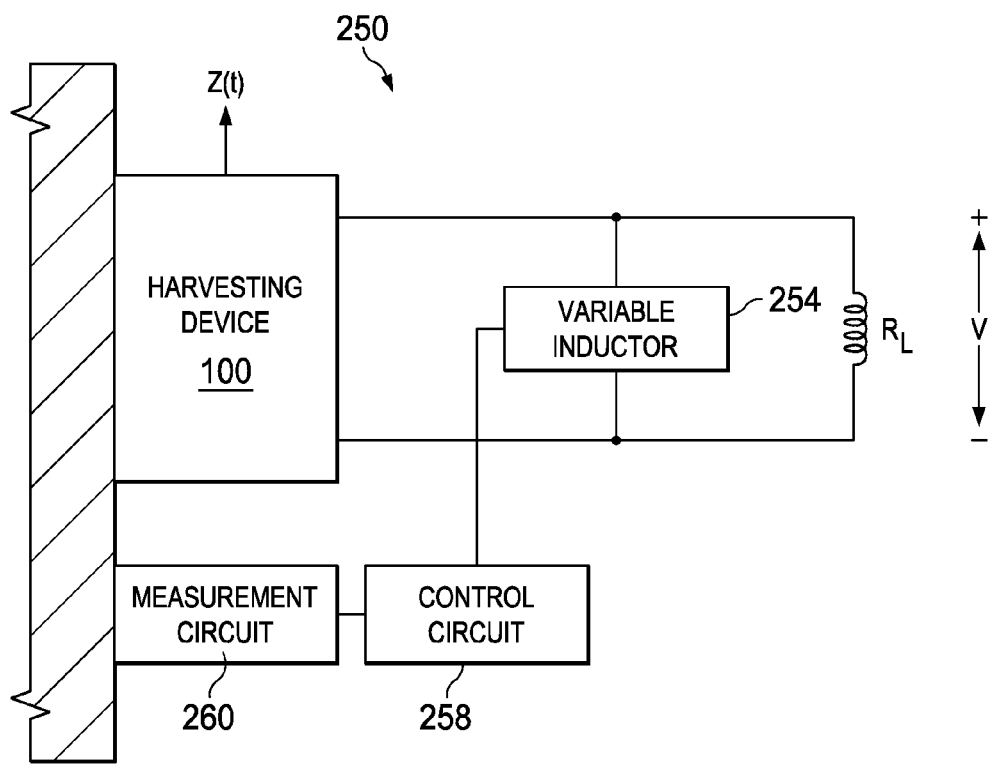
FIG. 4 is an embodiment of a harvesting device using a tunable inductor to change the phase of the output voltage relative to the phase of the vibration source displacement.

In some embodiments, a tunable or variable inductor may be used to adjust the phase of the output voltage V. FIG. 4 shows an embodiment of a circuit 250 that uses a variable inductor 254 for adjusting or tuning the phase of the output voltage V. The circuit 250 is connected to the harvesting device 100 as illustrated by the equivalent circuit 130 described above. The variable inductor 254 is controlled by a control circuit 258 that determines the correct inductance value and sends a signal to the variable inductor 254, which causes the variable inductor 254 to adjust to the correct value. The control circuit 258 is sometimes referred to as an inductance optimization circuit. A measurement circuit 260 measures the displacement Z(t) of the vibration source and outputs a signal to the control circuit 258 that is proportional to the displacement Z(t) of the source.

The circuit 250 operates by monitoring the displacement Z(t) of the vibration source by way of the measuring circuit 260. When the frequency ω of the vibration source is less than the mechanical frequency $\omega_m$, the control circuit 258 receives the signal from the measurement circuit 260 and causes the variable inductor 254 to change so that the phase of the output voltage V is positive ninety degrees relative to the vibration source. When the frequency ω of the vibration source is equal or substantially equal to the mechanical frequency $\omega_m$, the control circuit 258 causes the variable inductor 254 to change so that the phase of the vibration source is equal to the phase of the output voltage V. When the frequency ω of the vibration source is greater than the mechanical frequency $\omega_m$, the control circuit 258 tunes the variable inductor 254 so that the phase of the output voltage V is negative ninety degrees relative to the phase of the vibration source.

Figure 5A:
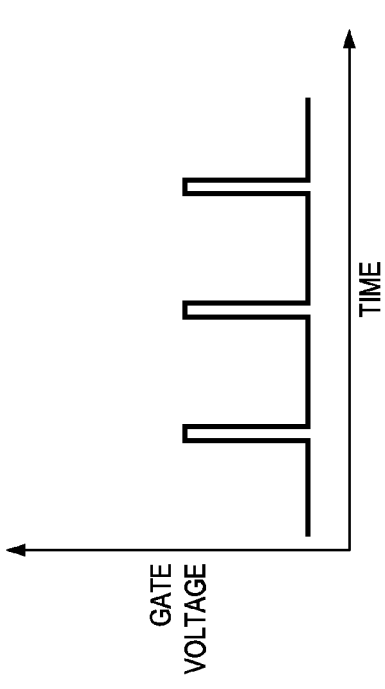
FIG. 5A is an embodiment of a bias flip circuit connected to an equivalent circuit of a harvesting device.
Figure 5B:
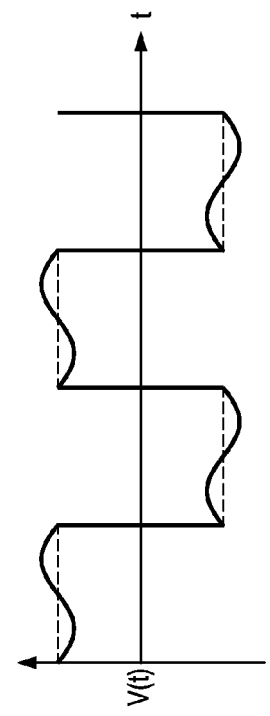
FIG. 5B is an example of the gate voltage on the switch of the bias flip circuit of FIG. 5A.

The circuit 250 of FIG. 4 may require a very large inductor as the variable inductor 254 and it may not be able to tune fast enough to operate with high frequency sources. The use of a bias flip circuit resolves the problem of the large inductor that may be required with the circuit 250. An example of a circuit using a bias flip is shown by the circuit 300 of FIG. 5A. The bias flip configuration of the circuit 300 is implemented using a relatively small inductor L that is connected within the circuit 300 by way of a switch, which in the configuration of FIG. 5A is a field effect transistor (FET) Q1. The bias flip configuration is able to flip the polarity of the voltage on the effective capacitance $C_{mc}$ of the harvesting device 100, FIG. 1, by opening and closing the FET Q1 as described further below. When the FET Q1 closes, the LC tank circuit of the inductor L and the capacitor $C_{mc}$ begins to resonate at a high frequency. In some embodiments, the tank circuit is allowed to oscillate for only half a period, at which time the FET Q1 is opened. An example of the gate voltage of the FET Q1 is shown in FIG. 5B wherein the gate is open when the voltage is low. The FET Q1 closes for a very short period. The result is that the bias on the capacitor $C_{mc}$ flips. The flipping of the bias on the capacitor $C_{mc}$ counters the effects of the capacitance. Thus, the bias flip simulates a large inductance connected in parallel with the capacitor $C_{mc}$ and provides an alternative to the variable inductor 254 of FIG. 4.

Figure 5C:
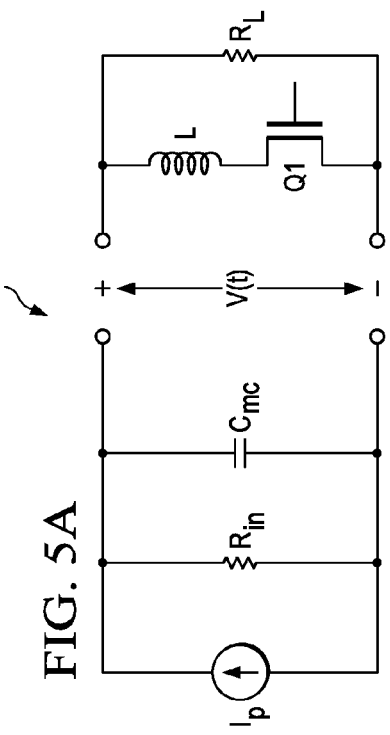
FIG. 5C is an example of the output current of the harvesting device of FIG. 5A.
Figure 5D:
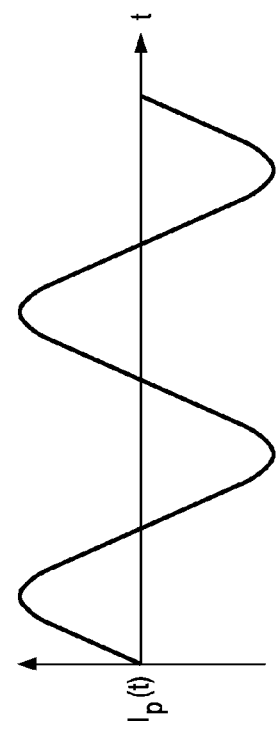
FIG. 5D is an example of the output voltage of the harvesting device of FIG. 5A when connected to the bias flip circuit.

The current $I_P(t)$ is shown in FIG. 5C and the voltage V(t) is shown in FIG. 5D. As shown, the bias flip circuit 300 is able to sync the phase of the voltage V(t) with the current $I_P(t)$, which yields the greatest power transfer from the harvesting device 100 to a load that is connected to the harvesting device 100. In some embodiments, the load is a rectification circuit and/or a storage circuit.

The bias flip circuit 300 may be self tuning by monitoring a parameter associated with the harvesting device 100 and flipping or triggering the bias when the parameter changes or reaches a predetermined value. An example of a harvesting device using the bias flip circuit 300 is shown by the circuit 350 of FIG. 6. The circuit 350 includes a bias flip circuit 352 as described above with reference to FIG. 5A. In addition, the circuit 350 includes a rectifier 354 connected to the output of the harvesting device 100. An energy management circuit 360 and a capacitor $C_{RECT}$ serve to store the energy generated by the harvesting device 100. The circuit 350 includes a source monitor 362 that monitors the displacement Z of the vibration source (not shown), which is referred to as Z(t) as a function of time. The source monitor 362 generates a signal that is input to a timing calculator 364. The timing calculator 364 monitors the displacement signal from the source monitor 362 and determines when to open and close the switch Q1, FIG. 5, in the bias flip circuit 352. It is noted that the energy management circuit 360 and/or the capacitor $C_{RECT}$ may serve as the resistive load $R_L$ described above.

The circuit 350 operates by monitoring the displacement Z(t) of the vibration source. In some embodiments, an accelerometer may be associated with the vibration source so that the displacement Z(t) may be determined by calculating the second integral of the acceleration. When the source is vibrating at a frequency ω in regions 1 or 3, FIG. 3, the timing calculator 364 triggers the bias flip circuit 352 to change state when the magnitude of the displacement Z(t) of the vibration source is at a maximum as measured by the source monitor 362. When the vibration source is vibrating at a frequency ω in region 2, the timing calculator 364 triggers the bias flip circuit 352 to change state when the source displacement equals zero or is at a minimum. The triggering of the bias flip circuit 300 typically causes the switch Q1 to change state for a very brief period as shown in FIG. 5B. The signal driving the switch Q2 is a function with a very short period. For example, if the vibration source frequency ω is 100 Hz, the period of the vibration source is 10 msec, but the time in which the switch Q1 is closed is on the order of 10 microseconds. By changing state, the source velocity and the force exerted on the vibration source remain in phase, which causes the maximum power transfer to the energy management circuit 360.

Another embodiment of using the bias flip circuit 300 with the harvesting device 100 is shown by the circuit 400 of FIG. 7. The circuit 400 includes an accelerometer 404 that measures the acceleration of the vibration source. The accelerometer 404 outputs a signal to a timing circuit 406 that is indicative of the acceleration of the vibration source. The timing circuit 406 functions in a very similar manner as the timing circuit 364 of FIG. 6 by causing a bias flip circuit 402 to trigger.

The circuit 400 functions in a very similar manner as the circuit 350 of FIG. 6. The accelerometer 404 measures the acceleration of the vibration source. When the vibration source is operating in either the first or third regions and the magnitude of the acceleration of the vibration source is at a maximum as measured by the accelerometer 404, the timing circuit 406 triggers the bias flip circuit 402. When the vibration source is operating in region 2, the timing circuit 406 triggers the bias flip circuit 3402 when the magnitude of the acceleration is zero.

Figure 8:
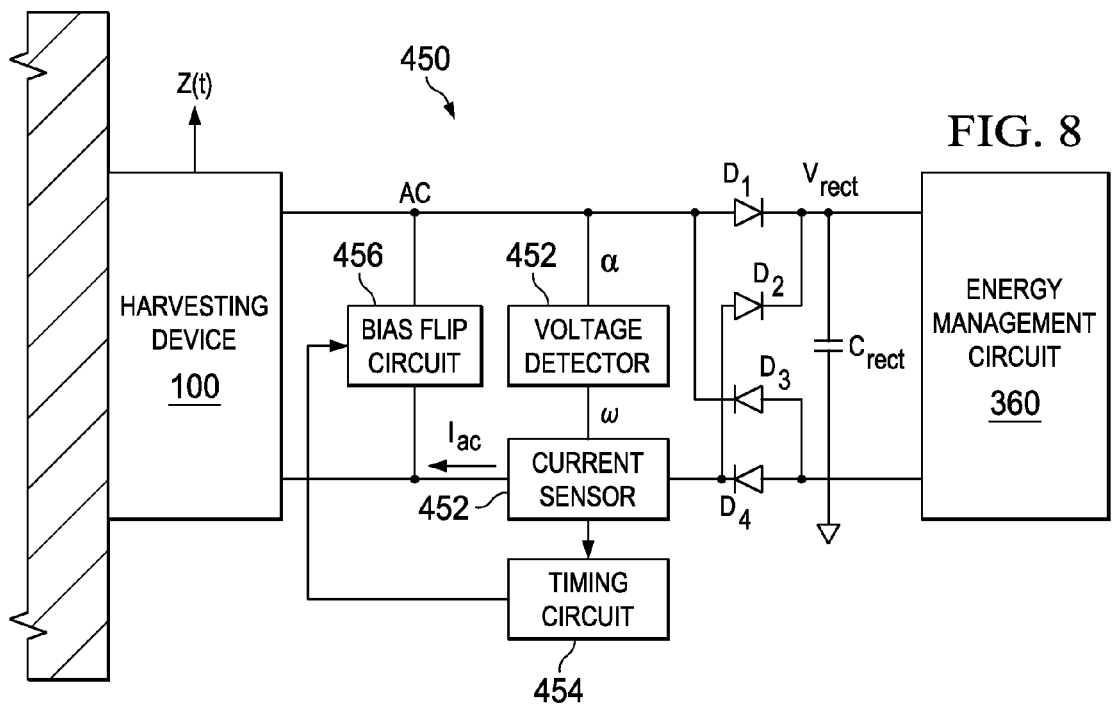
FIG. 8 is an embodiment of a harvesting device using a bias flip circuit to change the phase of the output voltage based on measurements of the output current waveform.

Another embodiment of using the bias flip circuit 300 is shown by the circuit 450 in FIG. 8. The circuit 450 includes a current sensor 452 that measures the current $I_{AC}$ at the output of the harvesting device 100. The energy management circuit 360 may be the load resistance $R_L$ in some embodiments where an energy storage device is used to store the energy generated by the harvesting device 100. The timing circuit 454 triggers the bias flip circuit 456 when the frequency ω of the vibration source is in regions 1 and 3 and the current $I_{AC}$ is at its maximum or the magnitude of the current $I_{AC}$ is at its maximum. When the frequency ω of the vibration source is in region 2, the timing circuit 454 triggers the bias flip circuit 456 when the current $I_{AC}$ is zero or at a minimum.

In some embodiments, an effective current $I_{eff}$ is calculated. The effective current $I_{eff}$ is calculated by measuring the voltage V of the harvesting device 100. Details of this calculation depend on the specifics of the energy management circuit 360.

In some embodiments, the load resistance $R_L$, FIGS. 2A and 2B, is variable. When the source frequency ω is equal to the mechanical frequency $\omega_M$, the load resistance $R_L$ is set to the value of the input resistance $R_P$. When the frequency ω of the vibration source is in either the first or third regions where it is less than or greater than the mechanical frequency $\omega_m$, the load resistance $R_L$ is set to be greater than the input resistance $R_{in}$. The change in the load resistance $R_L$ results in greater power transfer to the output of the harvesting device 100, FIG. 1.

While illustrative and presently preferred embodiments of harvesting devices have been described in detail herein, it is to be understood that the inventive concepts may be otherwise variously embodied and employed and that the appended claims are intended to be construed to include such variations except insofar as limited by the prior art.

What is claimed is:

1. A piezoelectric harvesting device comprising:
   a cantilever, the cantilever having a resonant frequency associated therewith, wherein the cantilever vibrates when in the presence of a vibration source, and wherein the piezoelectric harvesting device generates a current upon vibration of the cantilever;
   an output, wherein the generated current is present at the output; and
   a bias flip circuit that is used to tune the resonant frequency of the harvesting device based on measurements of the vibration source that causes the cantilever to vibrate, and wherein the bias flip circuit includes a switch that connects and disconnects an inductor to the output;
   wherein the switch in the bias flip circuit is controlled based on the displacement of the vibration source;
   wherein the switch of the bias flip circuit changes state when the magnitude of the displacement is at a maximum and the frequency of the vibration source is less than the resonant frequency of the cantilever.

2. A piezoelectric harvesting device comprising:
   a cantilever, the cantilever having a resonant frequency associated therewith, wherein the cantilever vibrates when in the presence of a vibration source, and wherein the piezoelectric harvesting device generates a current upon vibration of the cantilever;
   an output, wherein the generated current is present at the output; and
   a bias flip circuit that is used to tune the resonant frequency of the harvesting device based on measurements of the vibration source that causes the cantilever to vibrate, and wherein the bias flip circuit includes a switch that connects and disconnects an inductor to the output;
   wherein the switch in the bias flip circuit is controlled based on the displacement of the vibration source;
   wherein the switch of the bias flip circuit changes state when the magnitude of the displacement is at a maximum and the frequency of the vibration source is greater than the resonant frequency of the cantilever.

3. A piezoelectric harvesting device comprising:
a cantilever, the cantilever having a resonant frequency associated therewith, wherein the cantilever vibrates when in the presence of a vibration source, and wherein the piezoelectric harvesting device generates a current upon vibration of the cantilever;
an output, wherein the generated current is present at the output; and
a bias flip circuit that is used to tune the resonant frequency of the harvesting device based on measurements of the vibration source that causes the cantilever to vibrate, and wherein the bias flip circuit includes a switch that connects and disconnects an inductor to the output;
wherein the switch in the bias flip circuit is controlled based on the displacement of the vibration source;
wherein the switch of the bias flip circuit changes state when the magnitude of the displacement is zero and the frequency of the vibration source is substantially equal to the resonant frequency of the cantilever.

4. A piezoelectric harvesting device comprising:
a cantilever, the cantilever having a resonant frequency associated therewith, wherein the cantilever vibrates when in the presence of a vibration source, and wherein the piezoelectric harvesting device generates a current upon vibration of the cantilever;
an output, wherein the generated current is present at the output; and
a bias flip circuit that is used to tune the resonant frequency of the harvesting device based on measurements of the vibration source that causes the cantilever to vibrate, and wherein the bias flip circuit includes a switch that connects and disconnects an inductor to the output;
wherein the switch in the bias flip circuit is controlled based on the acceleration of the vibration source.

5. The piezoelectric harvesting device of claim 4, wherein the switch of the bias flip circuit changes state when the magnitude of the acceleration of the vibration source is at a maximum and the frequency of the vibration source is less than the resonant frequency of the cantilever.

6. The piezoelectric harvesting device of claim 4, wherein the switch of the bias flip circuit changes state when the magnitude of the acceleration of the vibration source is at a maximum and the frequency of the vibration source is greater than the resonant frequency of the cantilever.

7. The piezoelectric harvesting device of claim 4, wherein the switch of the bias flip circuit changes state when the acceleration of the vibration source is zero and the frequency of the vibration source is substantially equal to the resonant frequency of the cantilever.

8. A piezoelectric harvesting device comprising:
a cantilever, the cantilever having a resonant frequency associated therewith, wherein the cantilever vibrates when in the presence of a vibration source, and wherein the piezoelectric harvesting device generates an effective current upon vibration of the cantilever;
an output, wherein the effective current is present at the output; and
a bias flip circuit that is used to tune the resonant frequency of the harvesting device based on the current output by the harvesting device, and wherein the bias flip circuit includes a switch that connects and disconnects an inductor to the output;
wherein the switch of the bias flip circuit changes state when the current is at a maximum and the frequency of the vibration source is less than the resonant frequency of the cantilever.

9. A piezoelectric harvesting device comprising:
a cantilever, the cantilever having a resonant frequency associated therewith, wherein the cantilever vibrates when in the presence of a vibration source, and wherein the piezoelectric harvesting device generates an effective current upon vibration of the cantilever;
an output, wherein the effective current is present at the output; and
a bias flip circuit that is used to tune the resonant frequency of the harvesting device based on the current output by the harvesting device, and wherein the bias flip circuit includes a switch that connects and disconnects an inductor to the output;
wherein the switch of the bias flip circuit changes state when the magnitude of the current is at a maximum and the frequency of the vibration source is greater than the resonant frequency of the cantilever.

10. A piezoelectric harvesting device comprising:
a cantilever, the cantilever having a resonant frequency associated therewith, wherein the cantilever vibrates when in the presence of a vibration source, and wherein the piezoelectric harvesting device generates an effective current upon vibration of the cantilever;
an output, wherein the effective current is present at the output; and
a bias flip circuit that is used to tune the resonant frequency of the harvesting device based on the current output by the harvesting device, and wherein the bias flip circuit includes a switch that connects and disconnects an inductor to the output;
wherein the switch of the bias flip circuit changes state when the magnitude of the current is at a minimum and the frequency of the vibration source is substantially equal to the resonant frequency of the cantilever.

11. A piezoelectric harvesting device comprising:
a cantilever, the cantilever having a resonant frequency associated therewith, wherein the cantilever vibrates when in the presence of a vibration source, and wherein the piezoelectric harvesting device generates a current upon vibration of the cantilever;
an output, wherein the generated current is present at the output; and
a bias flip circuit that is used to tune the resonant frequency of the harvesting device based on the acceleration of the vibration source that causes the cantilever to vibrate, and wherein the bias flip circuit includes a switch that connects and disconnects an inductor to the output,
wherein the switch of the bias flip circuit changes state when the acceleration of the vibration source is at a maximum and the frequency of the vibration source is less than the resonant frequency of the cantilever; and
wherein the switch of the bias flip circuit changes state when the acceleration of the vibration source is at a maximum and the frequency of the vibration source is greater than the resonant frequency of the cantilever.

12. The piezoelectric harvesting device of claim 11, wherein the switch of the bias flip circuit changes state when the acceleration of the vibration source is at a minimum and the frequency of the vibration source is substantially equal to the resonant frequency of the cantilever.

* * * * *